(12) United States Patent
Eng et al.

(10) Patent No.: US 10,396,059 B2
(45) Date of Patent: Aug. 27, 2019

(54) MICROELECTRONIC DIE PACKAGES WITH METAL LEADS, INCLUDING METAL LEADS FOR STACKED DIE PACKAGES, AND ASSOCIATED SYSTEMS AND METHODS

(71) Applicant: Micron Technology, Inc., Boise, ID (US)

(72) Inventors: Meow Koon Eng, Singapore (SG); Yong Poo Chia, Singapore (SG); Suan Jeung Boon, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/038,621

(22) Filed: Jul. 18, 2018

(65) Prior Publication Data

US 2018/0323179 A1 Nov. 8, 2018

Related U.S. Application Data

(60) Continuation of application No. 15/474,854, filed on Mar. 30, 2017, now Pat. No. 10,056,359, which is a
(Continued)

(30) Foreign Application Priority Data

Jul. 24, 2007 (SG) .................................. 200705422

(51) Int. Cl.
*H01L 25/10* (2006.01)
*H01L 23/31* (2006.01)
(Continued)

(52) U.S. Cl.
CPC ............ *H01L 25/105* (2013.01); *H01L 21/50* (2013.01); *H01L 23/3128* (2013.01);
(Continued)

(58) Field of Classification Search
CPC ... H01L 25/105; H01L 24/97; H01L 23/3128; H01L 23/49555; H01L 23/49811; H01L 24/11; H01L 24/17; H01L 2924/1434
(Continued)

(56) References Cited

U.S. PATENT DOCUMENTS

| | | |
|---|---|---|
| 3,746,934 A | 7/1973 | Stein |
| 5,107,328 A | 4/1992 | Kinsman |

(Continued)

FOREIGN PATENT DOCUMENTS

| | | |
|---|---|---|
| CN | 1842906 A | 10/2006 |
| EP | 0522518 A2 | 1/1993 |

(Continued)

OTHER PUBLICATIONS

EP Patent Application No. 08781981.9—European Office Action, dated Jul. 16, 2018, 10 pages.
(Continued)

*Primary Examiner* — Thinh T Nguyen
(74) *Attorney, Agent, or Firm* — Perkins Coie LLP

(57) ABSTRACT

Microelectronic die packages, stacked systems of die packages, and methods of manufacturing them are disclosed herein. In one embodiment, a system of stacked packages includes a first die package having a bottom side, a first dielectric casing, and first metal leads; a second die package having a top side attached to the bottom side of the first package, a dielectric casing with a lateral side, and second metal leads aligned with and projecting towards the first metal leads and including an exterior surface and an interior surface region that generally faces the lateral side; and metal solder connectors coupling individual first leads to individual second leads. In a further embodiment, the individual second leads have an "L" shape and physically contact corresponding individual first leads. In another embodiment,
(Continued)

the individual second leads have a "C" shape and include a tiered portion that projects towards the lateral side of the second casing.

20 Claims, 8 Drawing Sheets

Related U.S. Application Data division of application No. 14/882,088, filed on Oct. 13, 2015, now Pat. No. 9,653,444, which is a division of application No. 14/564,502, filed on Dec. 9, 2014, now Pat. No. 9,165,910, which is a division of application No. 14/029,455, filed on Sep. 17, 2013, now Pat. No. 8,906,744, which is a division of application No. 13/492,554, filed on Jun. 8, 2012, now Pat. No. 8,536,702, which is a division of application No. 12/955,666, filed on Nov. 29, 2010, now Pat. No. 8,198,720, which is a continuation of application No. 11/863,425, filed on Sep. 28, 2007, now Pat. No. 7,843,050.

(51) Int. Cl.
　　H01L 23/495　　(2006.01)
　　H01L 23/498　　(2006.01)
　　H01L 23/00　　(2006.01)
　　H01L 21/50　　(2006.01)
　　H01L 25/00　　(2006.01)
　　H01L 21/56　　(2006.01)

(52) U.S. Cl.
　　CPC .. *H01L 23/49555* (2013.01); *H01L 23/49811* (2013.01); *H01L 23/49861* (2013.01); *H01L 24/11* (2013.01); *H01L 24/17* (2013.01); *H01L 24/18* (2013.01); *H01L 24/19* (2013.01); *H01L 24/20* (2013.01); *H01L 24/27* (2013.01); *H01L 24/32* (2013.01); *H01L 24/33* (2013.01); *H01L 24/83* (2013.01); *H01L 24/96* (2013.01); *H01L 24/97* (2013.01); *H01L 25/50* (2013.01); *H01L 21/568* (2013.01); *H01L 23/3121* (2013.01); *H01L 2224/04105* (2013.01); *H01L 2224/05548* (2013.01); *H01L 2224/05568* (2013.01); *H01L 2224/05573* (2013.01); *H01L 2224/12105* (2013.01); *H01L 2224/16* (2013.01); *H01L 2224/16258* (2013.01); *H01L 2224/17106* (2013.01); *H01L 2225/1023* (2013.01); *H01L 2225/1029* (2013.01); *H01L 2225/1035* (2013.01); *H01L 2225/1058* (2013.01); *H01L 2225/1064* (2013.01); *H01L 2924/01078* (2013.01); *H01L 2924/01079* (2013.01); *H01L 2924/14* (2013.01); *H01L 2924/1434* (2013.01); *H01L 2924/181* (2013.01)

(58) Field of Classification Search
　　USPC ........ 257/737, 738, 685, 686, 706, E23.023; 438/107, 109, 110
　　See application file for complete search history.

(56) References Cited

U.S. PATENT DOCUMENTS

| | | |
|---|---|---|
| 5,128,831 A | 7/1992 | Fox, III et al. |
| 5,138,434 A | 8/1992 | Wood et al. |
| 5,145,099 A | 9/1992 | Wood et al. |
| 5,252,857 A | 10/1993 | Kane et al. |
| 5,356,838 A | 10/1994 | Kim |
| 5,518,957 A | 5/1996 | Kim |
| 5,554,886 A | 9/1996 | Song et al. |
| 5,593,927 A | 1/1997 | Farnworth et al. |
| 5,677,566 A | 10/1997 | King et al. |
| 5,760,471 A | 6/1998 | Fujisawa et al. |
| 5,801,439 A | 9/1998 | Fujisawa et al. |
| 5,807,762 A | 9/1998 | Akram et al. |
| 5,811,877 A | 9/1998 | Miyano et al. |
| 5,826,628 A | 10/1998 | Hamilton |
| 5,835,988 A | 11/1998 | Ishii et al. |
| 5,851,845 A | 12/1998 | Wood et al. |
| 5,879,965 A | 3/1999 | Jiang et al. |
| 5,883,426 A | 3/1999 | Tokuno et al. |
| 5,891,797 A | 4/1999 | Farrar |
| 5,894,218 A | 4/1999 | Farnworth et al. |
| 5,933,713 A | 8/1999 | Farnworth |
| 5,938,956 A | 8/1999 | Hembree et al. |
| 5,946,553 A | 8/1999 | Wood et al. |
| 5,986,209 A | 11/1999 | Tandy |
| 5,990,566 A | 11/1999 | Farnworth et al. |
| 5,994,784 A | 11/1999 | Ahmad |
| RE36,469 E | 12/1999 | Wood et al. |
| 6,002,167 A | 12/1999 | Hatano et al. |
| 6,004,867 A | 12/1999 | Kim et al. |
| 6,008,070 A | 12/1999 | Farnworth |
| 6,018,249 A | 1/2000 | Akram et al. |
| 6,020,624 A | 2/2000 | Wood et al. |
| 6,020,629 A | 2/2000 | Farnworth et al. |
| 6,028,352 A | 2/2000 | Eide |
| 6,028,365 A | 2/2000 | Akram et al. |
| 6,030,858 A | 2/2000 | Cha et al. |
| 6,048,744 A | 4/2000 | Corisis et al. |
| 6,051,878 A | 4/2000 | Akram et al. |
| 6,064,194 A | 5/2000 | Farnworth et al. |
| 6,066,514 A | 5/2000 | King et al. |
| 6,072,233 A | 6/2000 | Corisis et al. |
| 6,072,236 A | 6/2000 | Akram et al. |
| 6,089,920 A | 7/2000 | Farnworth et al. |
| 6,097,087 A | 8/2000 | Farnworth et al. |
| 6,103,547 A | 8/2000 | Corisis et al. |
| 6,104,086 A | 8/2000 | Ichikawa et al. |
| 6,107,122 A | 8/2000 | Wood et al. |
| 6,111,312 A | 8/2000 | Hirumuta et al. |
| 6,124,634 A | 9/2000 | Akram et al. |
| 6,130,474 A | 10/2000 | Corisis |
| 6,133,068 A | 10/2000 | Kinsman |
| 6,133,622 A | 10/2000 | Corisis et al. |
| 6,146,919 A | 11/2000 | Tandy |
| 6,148,509 A | 11/2000 | Schoenfeld et al. |
| 6,150,710 A | 11/2000 | Corisis |
| 6,150,717 A | 11/2000 | Wood et al. |
| 6,153,924 A | 11/2000 | Kinsman |
| 6,159,764 A | 12/2000 | Kinsman et al. |
| 6,175,149 B1 | 1/2001 | Akram |
| 6,184,465 B1 | 2/2001 | Corisis |
| 6,187,615 B1 | 2/2001 | Kim et al. |
| 6,188,232 B1 | 2/2001 | Akram et al. |
| 6,198,172 B1 | 3/2001 | King et al. |
| 6,201,304 B1 | 3/2001 | Moden |
| 6,212,767 B1 | 4/2001 | Tandy |
| 6,214,716 B1 | 4/2001 | Akram |
| 6,225,689 B1 | 5/2001 | Moden et al. |
| 6,228,548 B1 | 5/2001 | King et al. |
| 6,228,687 B1 | 5/2001 | Akram et al. |
| 6,229,202 B1 | 5/2001 | Corisis |
| 6,232,666 B1 | 5/2001 | Corisis et al. |
| 6,235,552 B1 | 5/2001 | Kwon et al. |
| 6,235,554 B1 | 5/2001 | Akram et al. |
| 6,239,489 B1 | 5/2001 | Jiang |
| 6,242,798 B1 | 6/2001 | Cha et al. |
| 6,246,108 B1 | 6/2001 | Corisis et al. |
| 6,246,110 B1 | 6/2001 | Kinsman et al. |
| 6,247,629 B1 | 6/2001 | Jacobson et al. |
| 6,252,772 B1 | 6/2001 | Allen |
| 6,258,623 B1 | 7/2001 | Moden et al. |
| 6,258,624 B1 | 7/2001 | Corisis |
| 6,259,153 B1 | 7/2001 | Corisis |
| 6,261,865 B1 | 7/2001 | Akram |
| 6,265,766 B1 | 7/2001 | Moden |

(56) References Cited

U.S. PATENT DOCUMENTS

| | | |
|---|---|---|
| 6,271,580 B1 | 8/2001 | Corisis |
| 6,281,042 B1 | 8/2001 | Ahn et al. |
| 6,281,577 B1 | 8/2001 | Oppermann et al. |
| 6,284,571 B1 | 9/2001 | Corisis et al. |
| 6,285,204 B1 | 9/2001 | Farnworth |
| 6,291,894 B1 | 9/2001 | Farnworth et al. |
| 6,294,839 B1 | 9/2001 | Mess et al. |
| 6,297,547 B1 | 10/2001 | Akram |
| 6,303,981 B1 | 10/2001 | Moden |
| 6,303,985 B1 | 10/2001 | Larson et al. |
| 6,310,390 B1 | 10/2001 | Moden |
| 6,313,998 B1 | 11/2001 | Kledzik et al. |
| 6,320,251 B1 | 11/2001 | Glenn |
| 6,326,697 B1 | 12/2001 | Farnworth |
| 6,326,698 B1 | 12/2001 | Akram |
| 6,329,222 B1 | 12/2001 | Corisis et al. |
| 6,329,705 B1 | 12/2001 | Ahmad |
| 6,331,221 B1 | 12/2001 | Cobbley |
| 6,331,448 B1 | 12/2001 | Ahmad |
| 6,344,976 B1 | 2/2002 | Schoenfeld et al. |
| 6,388,333 B1 | 5/2002 | Taniguchi et al. |
| 6,407,381 B1 | 6/2002 | Glenn et al. |
| 6,429,528 B1 | 8/2002 | King et al. |
| 6,432,796 B1 | 8/2002 | Peterson |
| 6,433,418 B1 | 8/2002 | Fujisawa et al. |
| 6,437,449 B1 | 8/2002 | Foster |
| 6,437,586 B1 | 8/2002 | Robinson |
| 6,483,044 B1 | 11/2002 | Ahmad |
| 6,487,078 B2 | 11/2002 | Kledzik et al. |
| 6,503,780 B1 | 1/2003 | Glenn et al. |
| 6,548,376 B2 | 4/2003 | Jiang |
| 6,548,757 B1 | 4/2003 | Russell et al. |
| 6,552,910 B1 | 4/2003 | Moon et al. |
| 6,560,117 B2 | 5/2003 | Moon et al. |
| 6,564,979 B2 | 5/2003 | Savaria |
| 6,576,531 B2 | 6/2003 | Peng et al. |
| 6,607,937 B1 | 8/2003 | Corisis |
| 6,614,092 B2 | 9/2003 | Eldridge et al. |
| 6,652,910 B2 | 11/2003 | Pan et al. |
| 6,717,275 B2 | 4/2004 | Matsuura et al. |
| 6,746,894 B2 | 6/2004 | Fee et al. |
| 6,864,566 B2 | 3/2005 | Choi |
| 6,885,107 B2 | 4/2005 | Kinsman |
| 6,900,530 B1 | 5/2005 | Tsai |
| 7,006,360 B2 | 2/2006 | Kim |
| 7,015,587 B1 | 3/2006 | Poddar |
| 7,119,427 B2 | 10/2006 | Kim |
| 7,145,227 B2 | 12/2006 | Ebihara et al. |
| 7,279,784 B2 | 10/2007 | Liu |
| 7,394,148 B2 | 7/2008 | Karnezos |
| 7,692,931 B2 | 4/2010 | Chong et al. |
| 7,843,050 B2 | 11/2010 | Eng et al. |
| 8,198,720 B2 | 6/2012 | Eng et al. |
| 8,536,702 B2 | 9/2013 | Boon et al. |
| 8,906,744 B2 | 12/2014 | Eng et al. |
| 9,165,910 B2 | 10/2015 | Eng et al. |
| 9,653,444 B2 | 5/2017 | Eng et al. |
| 2002/0096760 A1 | 7/2002 | Simelgor et al. |
| 2004/0112633 A1 | 6/2004 | Endo et al. |
| 2005/0023668 A1 | 2/2005 | Ebihara et al. |
| 2005/0101056 A1 | 5/2005 | Song et al. |
| 2005/0104182 A1* | 5/2005 | Kim ............... H01L 25/105 257/686 |
| 2005/0127494 A1 | 6/2005 | Liu et al. |
| 2005/0242421 A1 | 11/2005 | Tandy |
| 2006/0068527 A1 | 3/2006 | Cobbley et al. |
| 2006/0138628 A1 | 6/2006 | Tzu |
| 2007/0013038 A1 | 1/2007 | Yang |
| 2007/0108560 A1 | 5/2007 | Tang et al. |
| 2007/0210441 A1 | 9/2007 | Corisis et al. |
| 2009/0026600 A1 | 1/2009 | Koon et al. |
| 2009/0045489 A1 | 2/2009 | Koon et al. |
| 2011/0068454 A1 | 3/2011 | Koon et al. |
| 2012/0241957 A1 | 9/2012 | Koon et al. |
| 2014/0015130 A1 | 1/2014 | Eng et al. |
| 2015/0091166 A1 | 4/2015 | Eng et al. |
| 2016/0099237 A1 | 4/2016 | Eng et al. |
| 2017/0207206 A1 | 7/2017 | Eng et al. |

FOREIGN PATENT DOCUMENTS

| | | |
|---|---|---|
| EP | 522518 A2 | 1/1993 |
| EP | 1503417 A1 | 2/2005 |
| JP | 6206058 A | 10/1985 |
| JP | 61018164 A | 1/1986 |
| JP | 08008389 A | 1/1996 |
| JP | 08116015 A | 5/1996 |
| JP | 08148635 A | 6/1996 |
| JP | 10041455 A | 2/1998 |
| JP | 11087601 A | 3/1999 |
| JP | 2001085606 A | 3/2001 |
| JP | 3544902 B2 | 7/2004 |
| JP | 2005051143 A | 2/2005 |
| KR | 20010056372 A | 7/2001 |
| KR | 20020024654 A | 4/2002 |
| WO | 2005017968 A2 | 2/2005 |
| WO | 2005022591 A2 | 3/2005 |

OTHER PUBLICATIONS

EP Patent Application No. 08781981.9—European Office Action, dated Sep. 15, 2017, 10 pages.
Examination Report dated Jan. 16, 2017 in European Patent Application No. 08781981.9, 7 pages.
International Search Report and Written Opinion dated Dec. 11, 2008 for International Application No. PCT/US2008/070325.
Office Action dated Apr. 18, 2011 in Republic of Korea Application No. 10-2010-7002652, 6 pages.
Office Action dated Apr. 26, 2011 in People's Republic of China Application No. 200880024992.4, 31 pages.
Office Action dated Jan. 19, 2012 in Taiwan Republic of China Application No. 097128170, 20 pages.
Office Action dated Mar. 22, 2012 in People's Republic of China Application No. 200880024992.4, 10 pages.
Office Action dated Nov. 1, 2011 in Republic of Korea Application No. 10-2010-7002652, 16 pages.
Office Action dated Nov. 13, 2012 in Japan Application No. 2010-518303, 6 pages.
Office Action dated Sep. 20, 2011 for Japan Application No. 2010-518303, 7 pages.
Search Report and Written Opinion dated Feb. 16, 2009 in Singapore Application No. 200705422-4.
U.S. Appl. No. 11/923,290, filed Oct. 24, 2007.
Written Opinion (corrected version) dated Jul. 1, 2009 in Singapore Application No. 200705422-4.

* cited by examiner

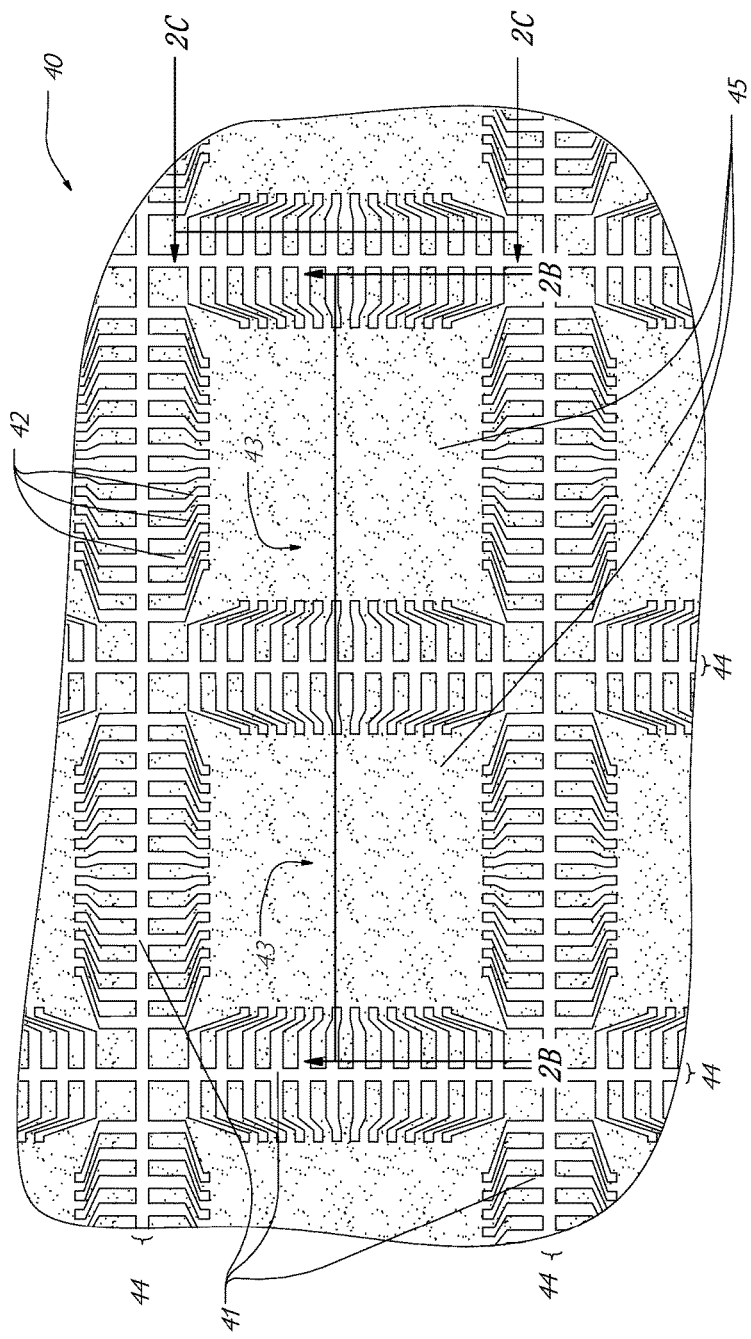
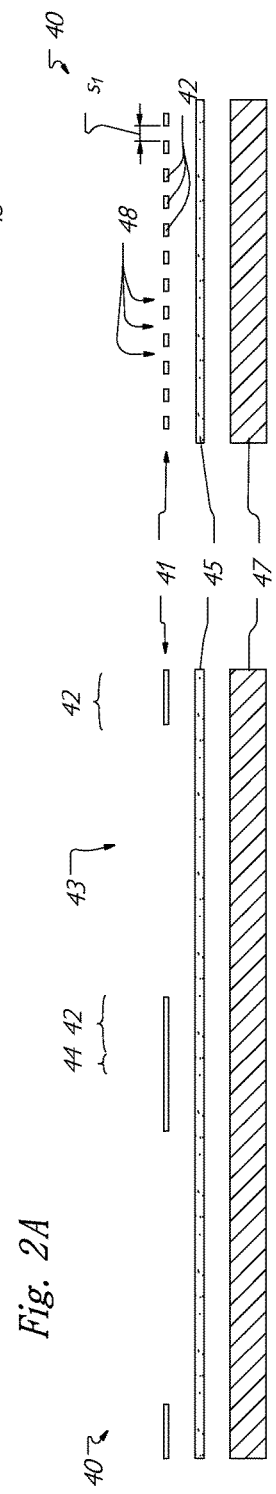
Fig. 2A
Fig. 2B
Fig. 2C

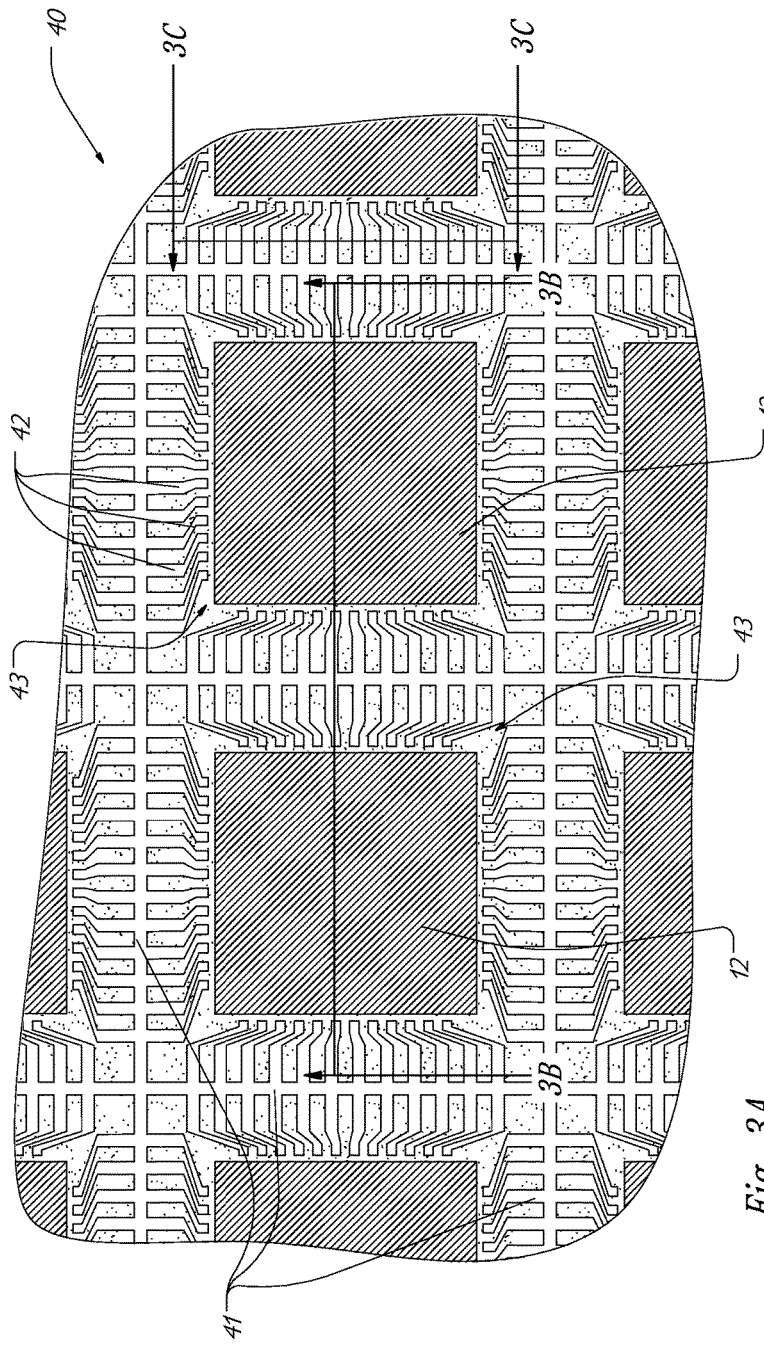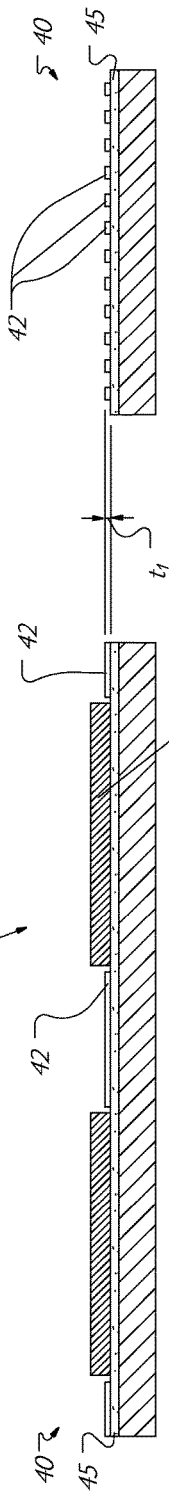
Fig. 3A
Fig. 3B
Fig. 3C

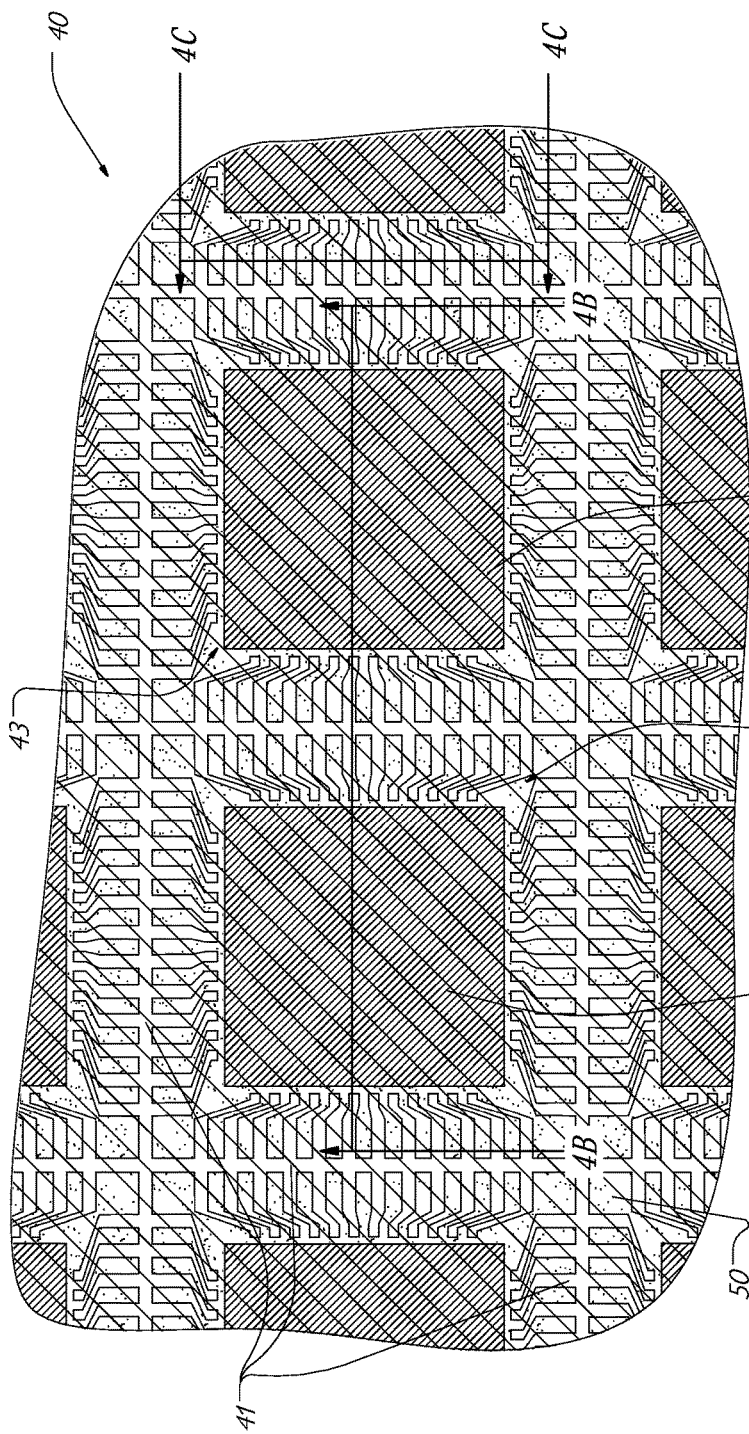
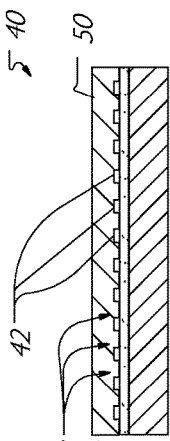
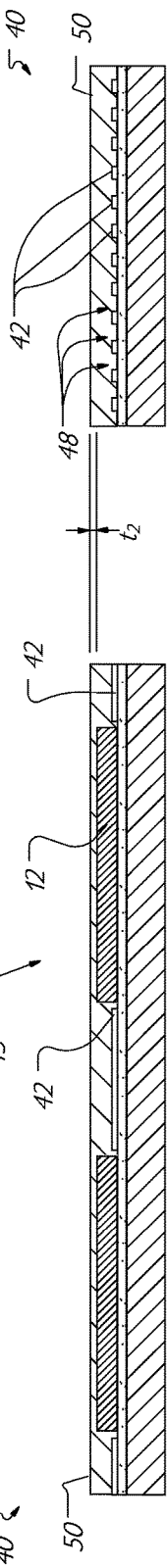
Fig. 4A
Fig. 4B
Fig. 4C

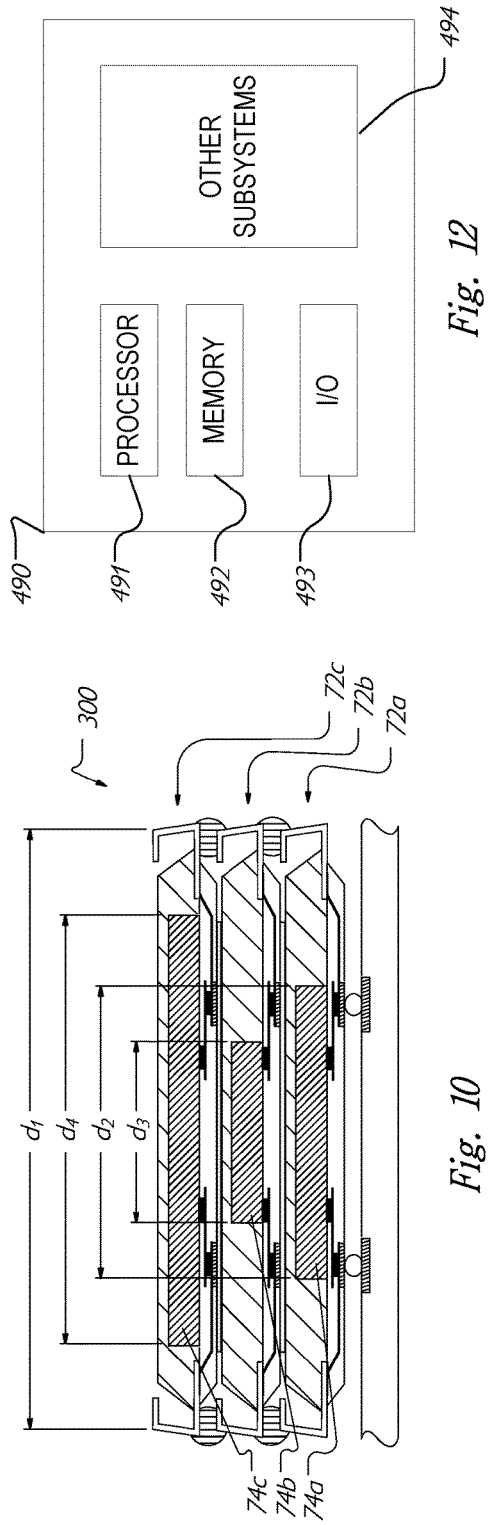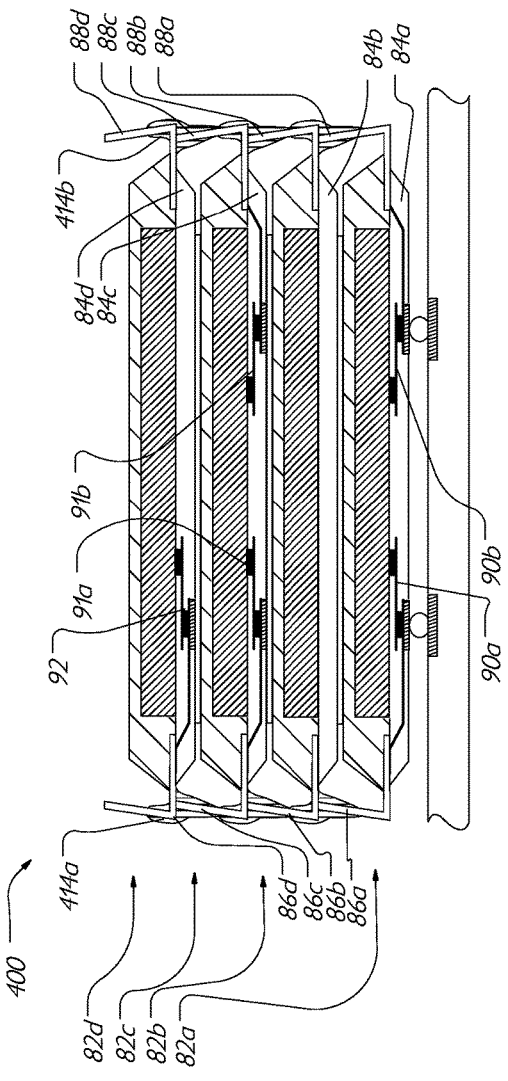

MICROELECTRONIC DIE PACKAGES WITH METAL LEADS, INCLUDING METAL LEADS FOR STACKED DIE PACKAGES, AND ASSOCIATED SYSTEMS AND METHODS

CROSS-REFERENCE TO RELATED APPLICATIONS

This application is a continuation of U.S. application Ser. No. 15/474,854, filed Mar. 30, 2017; which is a divisional of U.S. application Ser. No. 14/882,088, filed Oct. 13, 2015, now U.S. Pat. No. 9,653,444; which is a divisional of U.S. application Ser. No. 14/564,502, filed Dec. 9, 2014, now U.S. Pat. No. 9,165,910; which is a divisional of U.S. application Ser. No. 14/029,455, filed Sep. 17, 2013, now U.S. Pat. No. 8,906,744; which is divisional of U.S. application Ser. No. 13/492,554, filed Jun. 8, 2012, now U.S. Pat. No. 8,536,702; which is a divisional of U.S. application Ser. No. 12/955,666, filed Nov. 29, 2010, now U.S. Pat. No. 8,198,720; which is a continuation of U.S. application Ser. No. 11/863,425, filed Sep. 28, 2007, now U.S. Pat. No. 7,843,050; which claims foreign priority benefits of Singaporean Application No. 200705422-4, filed Jul. 24, 2007, now Singaporean Patent No. 149726; each of which is incorporated herein by reference in its entirety.

TECHNICAL FIELD

The present disclosure is directed generally to microelectronic die packages with metal leads, and more particularly to metal leads configured for stacked die packages.

BACKGROUND

Packaged microelectronic assemblies, such as memory chips and microprocessor chips, typically include a microelectronic die mounted to a substrate and encased in a plastic protective covering. The die includes functional features, such as memory cells, processor circuits, and interconnecting circuitry. The die also typically includes bond pads electrically coupled to the functional features. The bond pads are electrically connected to pins or other types of terminals that extend outside the protective covering for connecting the die to busses, circuits, or other microelectronic assemblies.

In one conventional arrangement, the die is mounted to a supporting substrate (e.g., a printed circuit board), and the die bond pads are electrically coupled to corresponding bond pads of the substrate with wirebonds. After encapsulation, the substrate can be electrically connected to external devices with solder balls or other suitable connections. Accordingly, the substrate supports the die and provides an electrical link between the die and the external devices.

In other conventional arrangements, the die can be mounted to a lead frame that has conductive lead fingers connected to a removable frame. The frame temporarily supports the lead fingers in position relative to the die during manufacture. Each lead finger is coupled to a corresponding bond pad of a die (e.g., via a wire bond or a metal redistribution layer), and the assembly is encapsulated in such a way that the frame and a portion of each of the lead fingers extend outside the encapsulating material. The frame is then trimmed off, and the exposed portions of each lead finger connect the die to external components. In general, individual lead fingers can be bent and then coupled to a corresponding external bond pad.

Die manufacturers have come under increasing pressure to reduce the volume occupied by the dies and yet increase the capacity of the resulting encapsulated assemblies. To meet these demands, die manufacturers often stack multiple dies on top of each other to increase the capacity or performance of the device within the limited surface area on the circuit board or other element to which the dies are mounted.

BRIEF DESCRIPTION OF THE DRAWINGS

FIG. 2A is a top view of a microelectronic assembly that includes a frame, a release layer, and a support substrate.

FIGS. 2B and 2C are partially exploded cross-sectional side views of the assembly of FIG. 2A.

FIG. 3A is a top view of the assembly of FIG. 2A having microelectronic dies positioned within openings of the frame.

FIGS. 3B and 3C are cross-sectional side views of the assembly of FIG. 3A.

FIG. 4A is a top view of the assembly of FIG. 3A encapsulated in a dielectric material.

FIGS. 4B and 4C are cross-sectional side views of the assembly of FIG. 4A.

FIG. 10 is a cross-sectional side view of a stacked system having microelectronic die packages that include dies of different sizes in accordance with an embodiment of the disclosure.

FIG. 11 is a cross-sectional side view of a stacked system having metal traces for selectively electrically coupling individual microelectronic die packages in accordance with an embodiment of the disclosure.

FIG. 12 is a schematic illustration of a system in which the microelectronic die packages and stacked systems may be incorporated.

DETAILED DESCRIPTION

Specific details of several embodiments of the disclosure are described below with reference to semiconductor devices and methods for fabricating semiconductor devices. The semiconductor components are manufactured on semiconductor wafers that can include substrates upon which or in which microelectronic devices, micromechanical devices, data storage elements, optics, read/write components, and other features are fabricated. For example, SRAM, DRAM (e.g., DDR/SDRAM), flash memory (e.g., NAND flash memory), processors, imagers, and other types of devices can be constructed on semiconductor wafers. Although many of the embodiments are described below with respect to semiconductor devices that have integrated circuits, other types of devices manufactured on other types of substrates may be within the scope of the invention. Moreover, several other embodiments of the invention can have different configurations, components, or procedures than those described in this section. A person of ordinary skill in the art, therefore, will accordingly understand that the invention may have other embodiments with additional elements, or the invention may have other embodiments without several of the features shown and described below with reference to FIGS. 1-12.

Figure 1:
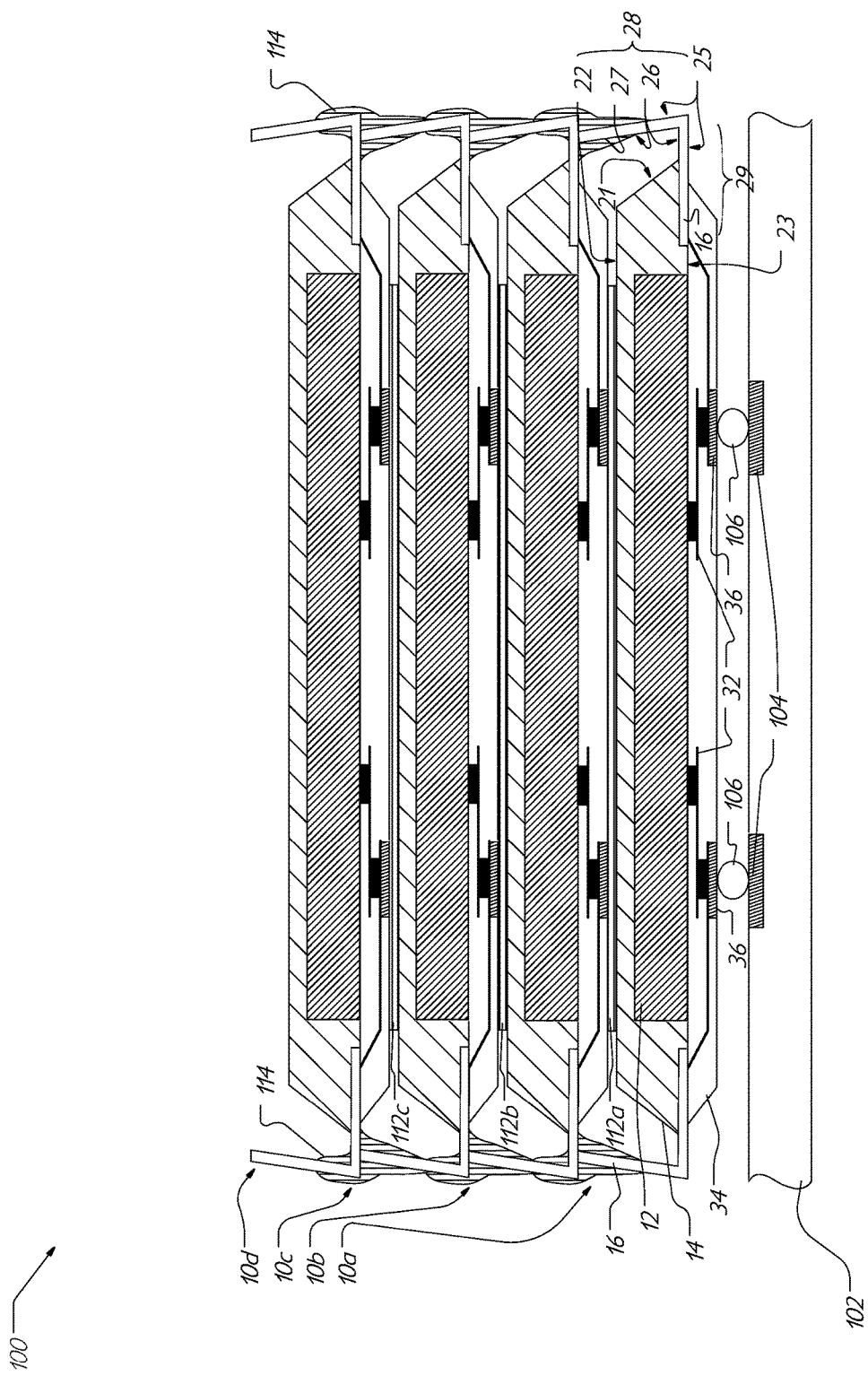
FIG. 1 is a cross-sectional side view of a stacked system that includes microelectronic die packages configured and stacked in accordance with an embodiment of the disclosure.

FIG. 1 is a cross-sectional side view of one embodiment of a stacked system 100 having a plurality of die packages 10 (identified individually by reference numbers 10a-d). Individual die packages 10 can include a microelectronic die 12, a molded dielectric casing 14, and metal leads 16 (or metal contacts) that are laterally spaced apart from the casing 14. The casing 14 has lateral casing sides 21, a top casing side 22, and a bottom casing side 23, and the casing 14 encapsulates at least a portion of the die 12 and the leads 16. In the example shown in FIG. 1, individual leads 16 are coupled to the bottom casing side 23 and project, at least in part, towards an above-located die package or the top of the stacked system 100. Individual leads 16 can further include an exterior lead surface 25 and an interior lead surface 26 having a region 27 that generally faces an individual lateral casing side 21. The interior surface region 27 of the illustrated example is located on an angled lead portion 28 of an individual lead 16, which is spaced laterally apart from the lateral casing side 21 by a lateral lead portion 29 of the lead. The die packages 10 can further include metal traces 32 that electrically couple the leads 16 to the die 12 and a dielectric spacer layer 34 encasing the traces 32 and a portion of an active side of the die 12. The die packages 10 can also include package bond pads 36 coupled to the traces 32. The stacked system 100, for example, has an interposer substrate 102 with metal bump pads 104 electrically connected to the package bond pads 36 at the first die package 10a by bond pad connections 106.

The embodiment of the stacked system 100 shown in FIG. 1 includes the four stacked die packages 10a-d physically coupled together at corresponding top and bottom sides by adhesive layers 112a-c, and the leads 16 of the die packages 10a-d are electrically coupled together by external inter-package connectors 114. The connectors 114, for example, can be metal solder lines formed along portions of the exterior lead surfaces 25 corresponding to sets of vertically aligned leads 16 and optionally along portions of the interior lead surfaces 26. Thus, the metal pads 104 are electrically coupled to microelectronic dies within the die packages 10a-d through conduction paths that include the leads 16 and the connectors 114. In many embodiments, and as shown in FIG. 1, the leads 16 corresponding to the die packages 10a-c extend beyond the top casing side 22, contact a portion of the exterior lead surface 25 on an above-located die package 10, and are held to the portion of the exterior lead surface 25 by an individual connector 114. Additionally, the embodiment of the individual connectors 114 shown in FIG. 1 attach to portions of the exterior and interior lead surfaces 25-26 along the angled and lateral lead portions 28-29. In alternative embodiments, the connectors 114 may attach only to a portion of the exterior lead surface 25 along the angled lead portion 28 and, optionally, a portion of the exterior lead surface 25 along the lateral lead portion 29. Accordingly, several embodiments of the connectors 114 project at least laterally outward from the angled lead portions 28 and may optionally extend in between individual die packages 10 towards the lateral casing sides 21.

The stacked system 100 may be formed by a method that includes stacking the die packages 10a-d and forming the connectors 114 at individual leads 16 of the die packages 10a-d. Stacking and aligning the leads 16 may include stacking the die packages 10a-d in sequence so that the leads 16 of one package are placed above or below corresponding leads on an adjacent die package and so that the leads 16 of a lower package project upwards towards the leads 16 of an upper package. The connectors 114 may be formed using wave or reflow soldering processes. In wave soldering processes, a pumped wave or cascade of liquid-phase metal solder can be applied across the angled lead portions 28. In reflow soldering processes, solder paste having metal powder particles can be applied across the angled lead portions 28 and then heated to melt the metal particles. In these or other soldering processes, the metal solder selectively wets (e.g., when heated) to at least a portion of the exterior lead surfaces 25 and optionally a portion of the interior lead surfaces 26, but the solder does not wet to the dielectric material of the casing 14. The connectors 114 are formed and individual leads 16 of an individual die package 10 are coupled with corresponding leads on an upper or lower die package when the metal solder cools. In other embodiments, some of the individual leads 16 may not physically contact a corresponding lead on an immediately adjacent die package such that only certain leads are interconnected with the adjacent die packages. In any these embodiments, the connectors 114 may bridge a vertical gap between vertically aligned leads 16 of adjacent dies (see, e.g., FIG. 9, reference 68). A vertical lead spacing distance of 60 microns or less, for example, may create adequate surface tension for forming a solder bridge between the individual leads 16.

In general, and in contrast to the stacked system 100, conventional methods of stacking packages or dies have been challenging and expensive. For example, because conventional leads are not arranged to face a dielectric casing or project towards an above-located die package, they can be difficult to position and can collapse underneath a package if not accurately aligned. In addition, attaching a conventional lead on one package to a conventional lead on a corresponding package is time-intensive and requires careful manual manipulation and inspection of each conventional lead-to-lead interconnection. For example, the conventional leads on an above-located die package are generally bent downward so that they project towards the lead on a below-located die package. When the conventional leads undergo an attachment process, the lead-to-lead connection needs to be inspected to verify that the bent lead is correctly positioned with the package below. Also, the process of stacking conventional packages is difficult to standardize because dies are made in a variety of sizes, and packages likewise vary in size. Thus, the process of stacking and interconnecting conventional packages needs to be tailored to an arrangement of a particular package type.

Several embodiments of microelectronic die packages 10 can be easy to stack and are robust. For example, after stacking and aligning the die packages 10a-d, the leads 16 of corresponding die packages are automatically sufficiently aligned for the connectors 114 to intercouple the leads and do not require manual manipulation to align the individual leads with respect to one another. Further, because the leads 16 extend outwardly from the lateral sides of the casing 14, they provide a contact surface that is located on both lateral and angled portions of an individual lead; this enables the die packages 10a-d to be intercoupled using a simple soldering process and creates reliable lead-to-lead interconnections that do not require stringent alignment tolerances. Also, the lateral casing sides 21 of the die package 10 can prevent the leads 16 from collapsing during die package stacking by providing a surface for an individual lead 16 to compress or spring back upon. In addition, the leads 16 can further establish the exterior package dimensions such that a standardized package size may be used to house a variety of differently sized dies as explained in further detail below with reference to FIG. 10.

FIGS. 2A-8B illustrate stages of forming a microelectronic die package in accordance with several embodiments of the disclosure. FIG. 2A is a top view of a microelectronic assembly 40 that includes a metal frame 41 situated on top of a release layer 45. The frame 41 comprises lead portions 42, openings 43, and dicing lanes 44. The openings 43 expose a portion of the release layer 45 for attaching and positioning a die 12 (FIG. 1) adjacent to the lead portions 42, and the dicing lanes 44 provide a cutting or cleavage path for singulating an individual die package from the frame 41 (described further with reference to FIGS. 8A and 8B). In one embodiment, the frame 41 may be made from copper and may include selective copper plating along the lead portions 42. In other embodiments, the frame 41 may comprise a variety of other metallic materials such as aluminum or an aluminum-copper alloy. The release layer 45 may be, for example, a thermal or UV release film.

FIGS. 2B and 2C are partially exploded cross-sectional side views of the assembly 40 showing the frame 41, the lead portions 42, the release layer 45, and a support substrate 47 (e.g., a silicon wafer or other type of structure having planar surface). FIG. 2B further shows an individual dicing lane 44, and FIG. 2C further shows gaps 48 between the individual lead portions 42. The gaps 48, along with the openings 43 and the support substrate 47, define bottom and lateral sides of a cavity, which will be subsequently filled with a dielectric material (described further with reference to FIGS. 4A-C). The individual lead portions 42 are spaced apart from each other by a spacing distance $s_1$, which should be large enough to prevent the connectors 114 from laterally bridging across individual leads.

FIG. 3A is a top view of the assembly 40 after attaching microelectronic dies to the release layer 45. FIG. 3A, more specifically, shows the frame 41, the lead portions 42, and the openings 43 with individual dies 12 placed within the openings 43 and adjacent to the lead portions 42. FIGS. 3B and 3C are cross-sectional side views further showing the openings 43 and the lead portions 42, which are below a top-side surface of the dies 12 and have a thickness $t_1$. In several embodiments, the lead portions 42 may have a thickness $t_1$ in the range of about 50 to 250 microns.

FIG. 4A is a top view of the assembly 40 after a dielectric material 50 has been formed on a top side of the metal frame 41 and a top side of the dies 12. The dielectric material 50, for example, may be a polymer or plastic that is heated and subsequently deposited on top of and within the gaps of the frame 41. The dielectric material 50, for example, can be molded over the frame 41 and the top sides of the dies 12. FIGS. 4B and 4C are cross-sectional side views showing the dielectric material 50 filling the openings 43 around the dies 12 and the gaps 48 between the lead portions 42. After curing or cooling, the hardened dielectric material 50 should form a protective and electrically isolative covering over the dies 12, within gaps between lateral sides of the dies 12 and the lead portions 42, and within the gaps 48 between the lead portions 42. The dielectric material 50 may optionally extend above the dies 12 by a thickness $t_2$ to completely encapsulate all of the dies 12 and lead portions 42.

Figure 5A:
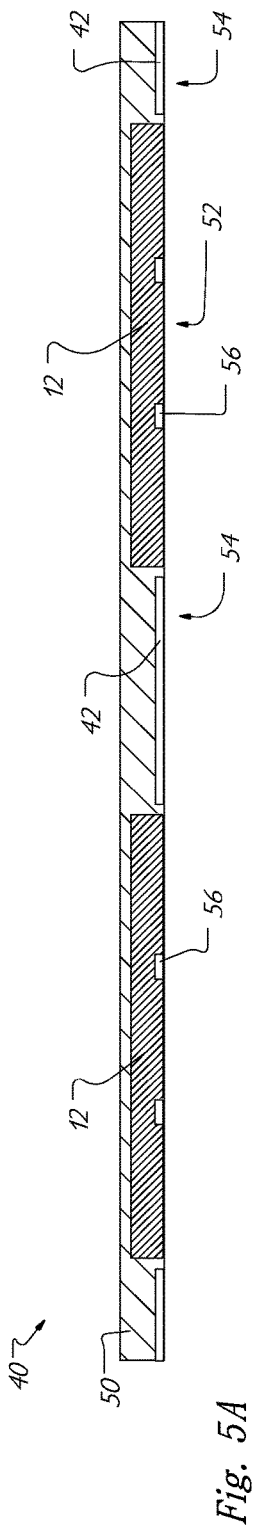
FIGS. 5A and 5B are cross-sectional side and bottom views of the assembly of FIG. 4A after removing the support substrate.
Figure 5B:
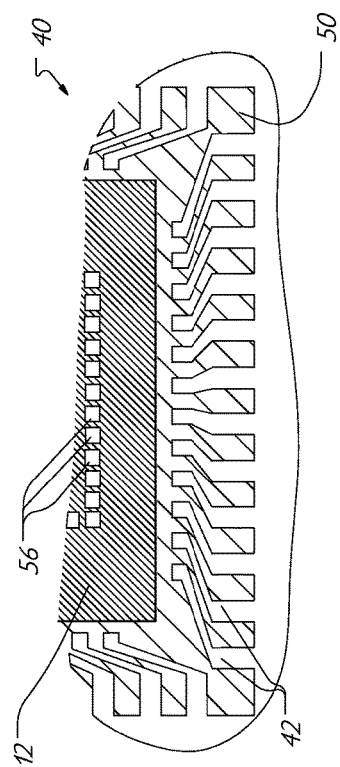

FIGS. 5A and 5B are cross-sectional side and bottom views of the assembly 40 after removing the release layer 45 and the support substrate 47 to expose bottom-side surfaces 52 (e.g., active side) of the dies 12 and expose bottom-side surfaces 54 of the lead portions 42. The bottom-side surfaces 52 of the dies 12 include bond pads 56 (or active features) electrically coupled to an integrated circuit within the dies 12 (not shown). The dielectric material 50 holds the dies 12 in place and separates the dies 12 from the lead portions 42.

Figure 6:
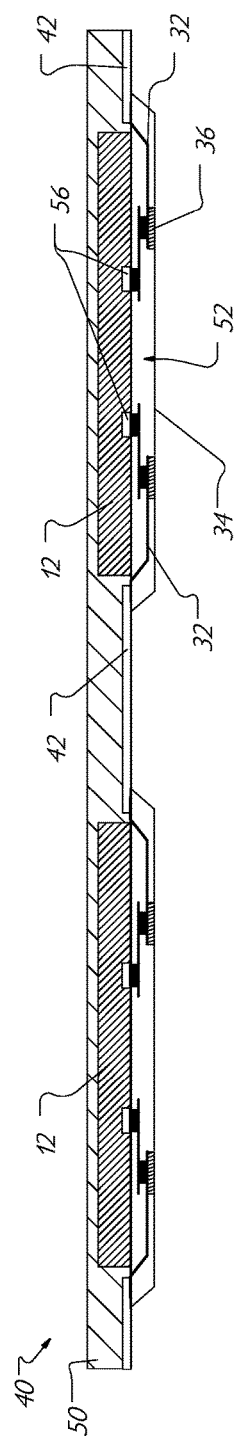
FIG. 6 is a cross-sectional side view of the assembly of FIGS. 5A and 5B after forming a spacer layer.

FIG. 6 is a cross-sectional side view of the assembly 40 after forming an embodiment of the dielectric spacer layer 34 at the bottom-side surfaces 52 of the dies 12. The spacer layer 34 includes the metal traces 32 electrically coupling the bond pads 56 to the lead portions 42 and the package bond pads 36. The spacer layer 34 may be made from a material such as a non-conductive oxide or polymer. The metal traces 32 and the package bond pads 36, for example, may be made from copper or aluminum. The spacer layer 34 can accordingly be a redistribution structure. It is also expected that in certain embodiments, the package bond pads 36 may be omitted. For example, in FIG. 1 the package bond pads of the die packages 10b-d could be omitted because these pads are not electrically connected to any external bond pads.

Figure 7:
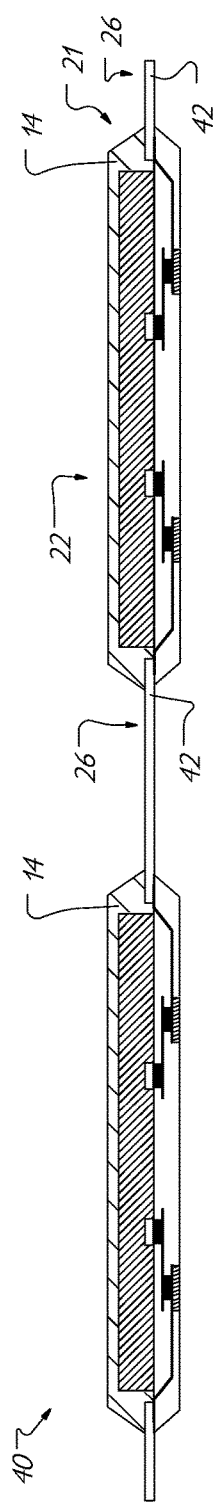
FIG. 7 is a cross-sectional side view of the assembly of FIG. 6A after partial removal of the dielectric material.

FIG. 7 is a cross-sectional side view of the assembly 40 after removing a portion of the dielectric material 50 by a chemical etch, backgrinding, or chemical-mechanical polishing process to form the casings 14. The dielectric material 50, for example, can be etched to expose the interior lead surfaces 26 (FIG. 1) and to form the top sides 22 and lateral casing sides 21 of the casings 14. Additionally, although shown as having sloped surfaces, the lateral casing sides 21 may be formed in other embodiments so that they are generally perpendicular to the top casing side 22. It is expected, however, that sloped, curved, tapered, or otherwise graded profiles of the lateral casing sides 21 provide an individual lead with room to bend or compress underneath an above-situated lead or die package. Also, sloped lateral casing sides 21 may be used to increase a lateral spacing distance between an individual lead and an upper portion the lateral casing side 21 to provide more room for forming a connector on the interior lead surface 26.

Figure 8A:
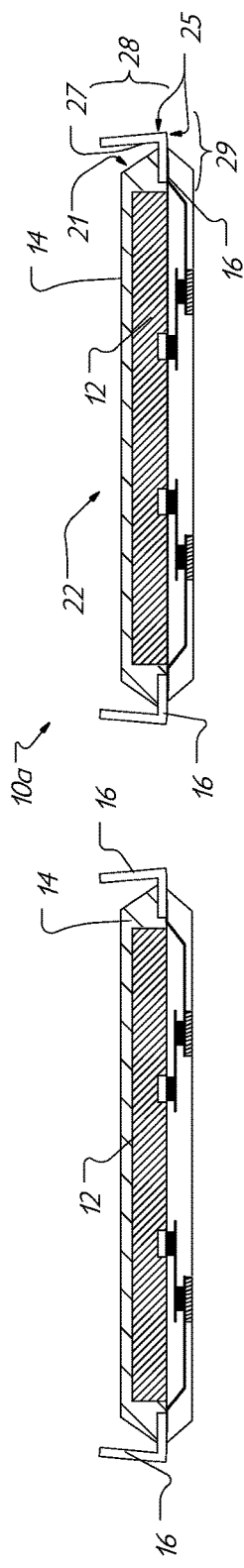
FIG. 8A is a cross-sectional side view of the assembly of FIG. 7 after singulation and formation of metal leads.
Figure 8B:
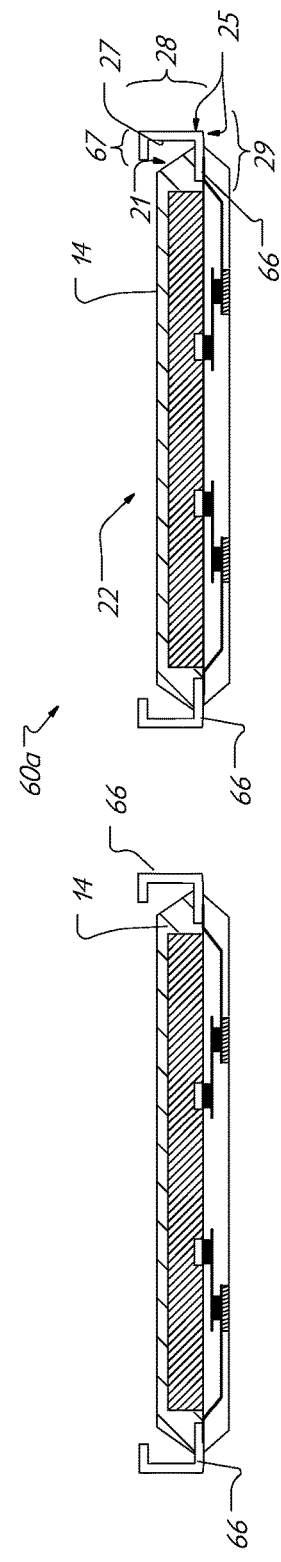
FIG. 8B is a cross-sectional side view of the assembly of FIG. 7 after singulation and formation of metal leads in accordance with an alternative embodiment of the disclosure.

FIG. 8A is a cross-sectional side view of an embodiment of the package 10a after singulation through the dicing lanes 44 (e.g., by trim and form equipment) to yield separated dies 12 housed in the casings 14 and coupled to individual "L"-type leads 16. FIG. 8B shows an alternative embodiment after singulation of a die package 60a that is formed to have individual "C"-type leads 66 that include a tiered lead portion 67 laterally extending toward the lateral casing sides 21. In both embodiments, the lateral lead portion 29 projects away from the lateral casing side 21, the angled lead portion 28 extends away from the lateral lead portion 29 so that the interior surface region 27 is generally aligned with a surface at the lateral casing side 21, and the exterior lead surface 25 generally faces away from the lateral casing side 21 and is arranged to receive an external inter-package connector. The angled lead portion 28 may include a variety of angled, curved, or otherwise sloped profiles, which can optionally include a profile that is substantially perpendicular to the lateral lead portion 29 or a profile that is substantially sloped toward the lateral casing side 21. In the embodiment of FIG. 8B, the angled lead portion 28 is substantially perpendicular with the lateral lead portion 29, and the angled lead portion 28 positions the tiered lead portion 67 above the lateral lead portion 29. This allows an individual lead 66 to accommodate additional types of external inter-package connectors, such as metal solder bumps (see, e.g., FIG. 9). Accordingly, the die package(s) 10a or 60a may be placed within a stacked system, such as the stacked system 100, and the connectors 114 can be formed along the die packages 10a or 60a at any of the exposed or otherwise accessible surfaces of the leads 16 or 66 at the angled lead portion 28, the lateral lead portion 29, or the tiered lead portion 67.

Figure 9:
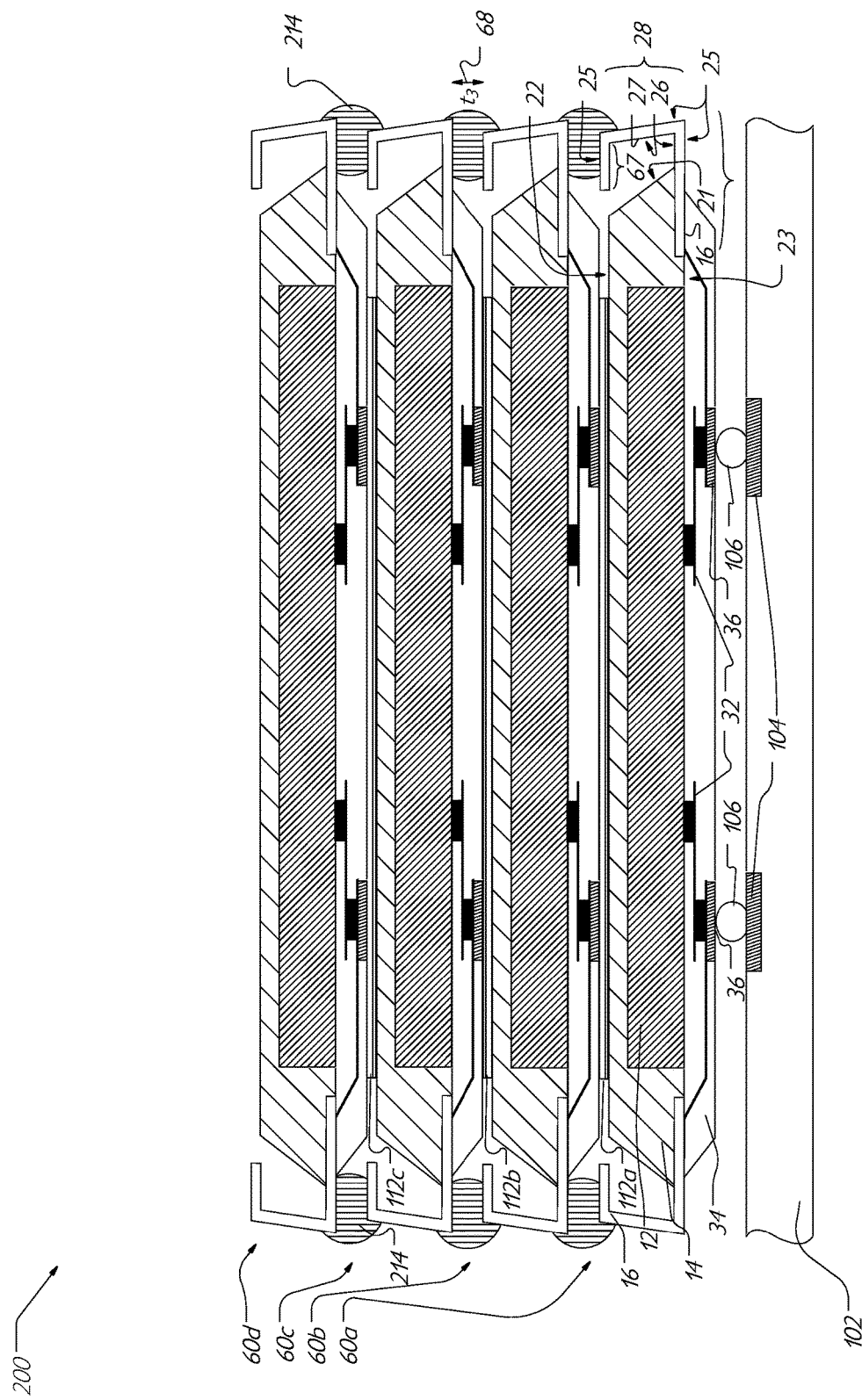
FIG. 9 is a cross-sectional side view of a stacked system that includes microelectronic die packages configured and stacked in accordance with an alternative embodiment of the disclosure.

FIG. 9 is a cross-sectional side view of an embodiment of a stacked system 200 that includes the individual die package 60a as well as die packages 60b-d physically coupled together, at least in part, by adhesive layers 112a-c. The leads 66 of the die packages 60a-d are physically and electrically coupled together by external inter-package connectors 214. In this embodiment, the connectors 214 include metal solder bumps interposed between the tiered lead portions 67 and the lateral lead portions 29 on corresponding die packages. The leads 66 of the individual die packages 60 are vertically separated from each other by a gap 68 spanning a distance $t_3$, which may be on the order of 60 microns or less. Individual connectors 214 bridge the gaps 68 and attach to portions of the exterior lead surfaces 25 along the tiered lead portions 67 as well as the angled and lateral lead portions 28-29. Similar to the stacked system 100, the stacked system 200 may be formed by a method that includes stacking the die packages 60a-d such that the leads 66 of the die packages 60a-d are aligned, and forming the connectors 214 at individual leads 66 of the die packages 60a-d. The connectors 214 may be formed using a metal solder bump process that includes forming a dot of metal solder that attaches to portions of the exterior lead surfaces 25. As shown, the dot of solder may be configured to attach to the exterior lead surface 25 along the angled lead portions 28 such that the connectors 214 are positioned between the individual die packages 60a-d and project outward from the lateral lead portions 29. In other embodiments, the connectors 214 may be further coupled to portions of the interior lead surfaces 26.

FIG. 10 is a cross-sectional side view showing an embodiment of a stacked system 300 that includes microelectronic die packages 72a-c having corresponding microelectronic dies 74a-c. The die packages 72a-c share a common lateral dimension $d_1$, but the microelectronic dies 74a-c have different lateral dimensions $d_2$, $d_3$, and $d_4$ (not in that order). In one embodiment, the stacked system 300 may be a memory module that includes an interface circuit at the die 74a, a control circuit at the die 74b, and a memory at the die 74c. Because the packages 72a-c share the common lateral dimension $d_1$, a myriad of different types of stacked systems may be created by stacking preferred die packages or exchanging certain die packages. For example, an alternative embodiment of the DRAM-based memory module could be assembled by using smaller magnetoresistive RAM (MRAM) based dies housed in die packages having the lateral dimension $d_1$. Accordingly, DRAM-based die packages 72b-c could be exchanged for MRAM-based die packages.

FIG. 11 is a cross-sectional side view showing an embodiment of a stacked system 400 that includes microelectronic die packages 82a-d separated by dielectric spacer layers 84a-d and having corresponding first metal leads 86a-d and second metal leads 88a-d respectively coupled together by first and second connectors 414a-b. In this view, the spacer layer 84a includes corresponding metal traces 90a-b, the spacer layer 84c includes corresponding metal traces 91a-b, the spacer layer 84d includes a single metal trace 92, but the spacer layer 84b does not have any corresponding metal traces along this view of the second package 82b (i.e., the die packages 82a-d may have a different arrangement of metal traces in other cross-sectional views such that the second package 82b does not have metal traces along the illustrated cross-section). The first connector 414a is applied across the first leads 86a-d to selectively electrically couple first, third, and fourth packages 82a, 82c, and 82d; and the second connector 414b is applied across the second leads 88a-d to selectively electrically couple the first and third packages 82a and 82c. Thus, one side of the die package 82d and both sides of the die package 82b are electrically isolated from the connectors 414a-b. The process of stacking the die packages 82a-d can be the same as the process described with reference to FIGS. 1 and 9. The process of forming the die packages 82a-d can be similar to the method of manufacturing described with reference to FIGS. 2A-8B, but instead of connecting a metal trace to every metal lead, individual metal trace-lead couplings have been omitted.

Many other types of variations may be made to the above described stacked systems, including various combinations of certain features associated with these systems. For example, in lieu of the bond pad connections 106 (FIGS. 1 and 9), wire bonds may electrically couple a stacked system to an interposer substrate. In some embodiments, the adhesive layers interposed between the stacked packages may be omitted. The external inter-package connectors alone, for example, could be used to hold individual die packages together by temporarily clamping the packages until metal solder is applied and the connectors are formed. In other embodiments, the connectors can be configured to selectively route individual sets of the leads by applying metal solder across a limited number of leads. Leads that are not soldered remain electrically isolated from the stacked system. In one specific embodiment, a stacked system includes die packages that house the same type of die. For example, a stacked system could be a memory, such as a static dynamic access memory (SRAM). In this embodiment, individual leads would provide word and bit line access to individual SRAM dies housed in the individual die packages. Accordingly, the aggregated individual SRAM dies form a large SRAM, which has a reduced footprint relative to a conventional SRAM of the same size. Also, the stacked system may include any number of individual microelectronic die packages having more or fewer packages than those presented in the illustrated embodiments.

Any one of the microelectronic devices described above with reference to FIGS. 1-11 can be incorporated into any of a myriad of larger or more complex systems 490, a representative one of which is shown schematically in FIG. 12. The system 490 can include a processor 491, a memory 492 (e.g., SRAM, DRAM, Flash, or other memory device), input/output devices 493, or other subsystems or components 494. Microelectronic devices may be included in any of the components shown in FIG. 12. The resulting system 490 can perform any of a wide variety of computing, processing, storage, sensor, imaging, or other functions. Accordingly, representative systems 490 include, without limitation, computers or other data processors, for example, desktop computers, laptop computers, Internet appliances, hand-held devices (e.g., palm-top computers, wearable computers, cellular or mobile phones, personal digital assistants), multi-processor systems, processor-based or programmable consumer electronics, network computers, and minicomputers. Other representative systems 490 include cameras, light or other radiation sensors, servers and associated server subsystems, display devices, or memory devices. In such systems, individual dies can include imager arrays, such as CMOS imagers. Components of the system 490 may be housed in a single unit or distributed over multiple, interconnected units, e.g., through a communications network. Components can accordingly include local or remote memory storage devices and any of a wide variety of computer-readable media.

From the foregoing, it will be appreciated that specific embodiments have been described herein for purposes of illustration, but well-known structures and functions have not been shown or described in detail to avoid unnecessarily obscuring the description of the foregoing embodiments. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is inclusive and is used throughout to mean including at least the recited feature(s) such that any greater number of the same feature or additional types of other features are not precluded. It will also be appreciated that specific embodiments have been described herein for purposes of illustration, but that various modifications may be made without deviating from the inventions. For example, many of the elements of one embodiment can be combined with other embodiments in addition to, or in lieu of, the elements of the other embodiments. Accordingly, the invention is not limited except as by the appended claims.

We claim:

1. A stacked system of microelectronic devices, comprising:
    a first microelectronic device having a first die, a first bottom side, and first metal leads coupled to the first bottom side;
    a second microelectronic device having a second die, a top side, a lateral side, a second bottom side, a second bottom side bond-site, and second metal leads coupled to the second bottom side, the second leads including a lateral portion that laterally projects away from the lateral side, a tiered portion that laterally projects towards the lateral side, and an angled portion between the lateral portion and the tiered portion that positions the tiered portion above the lateral portion;
    metal solder bumps between individual first leads and individual tiered portions of the second leads;
    a support substrate adjacent to and spaced apart from the second bottom side, the support substrate having a substrate bond-site; and
    a substrate connector attached to the substrate bond-site and to the second bottom side.

2. The stacked system of claim 1 wherein the first die has a first lateral dimension, and wherein the second die has a second lateral dimension.

3. The stacked system of claim 1 wherein a first dielectric casing defines at least a portion of the first bottom side, and wherein a second dielectric casing defines at least a portion of the top side, and wherein the first and second dielectric casings have substantially equal lateral dimensions.

4. The stacked system of claim 1 further comprising an adhesive layer positioned between the top side of the second microelectronic device and the first bottom side of the first microelectronic device.

5. The stacked system of claim 1 wherein the metal solder bumps are further attached to the individual second leads of the second microelectronic device at a surface of the angled portion that generally faces away from the lateral side of the second casing.

6. The stacked system of claim 1 wherein the tiered portion is separated from a corresponding first lead by a vertical distance of up to 60 microns.

7. The stacked system of claim 1 wherein the angled portion is substantially perpendicular to the lateral portion.

8. The stacked system of claim 1 wherein the angled portion is substantially perpendicular to the tiered portion.

9. The stacked system of claim 1 wherein the lateral portion is substantially parallel to the tiered portion.

10. The stacked system of claim 1 wherein the second microelectronic device has a redistribution structure at the second bottom side.

11. The stacked system of claim 10 wherein the redistribution structure includes layered metal traces.

12. A stacked system of microelectronic devices, comprising:
    a first microelectronic device having a first die, a first bottom side, and first metal leads coupled to the first bottom side;
    a second microelectronic device having a second die, a top side, a lateral side, a second bottom side, a second bottom side bond-site, and second metal leads coupled to the second bottom side, the second leads including a lateral portion that laterally projects away from the lateral side, a tiered portion that laterally projects towards the lateral side, and an angled portion between the lateral portion and the tiered portion that positions the tiered portion above the lateral portion, wherein the lateral side of the second microelectronic device has a sloped profile;
    metal solder bumps between individual first leads and individual tiered portions of the second leads;
    a support substrate adjacent to and spaced apart from the second bottom side, the support substrate having a substrate bond-site; and
    a substrate connector attached to the substrate bond-site and to the second bottom side.

13. The stacked system of claim 12 wherein the first die has a first lateral dimension, and wherein the second die has a second lateral dimension.

14. The stacked system of claim 12 wherein a first dielectric casing defines at least a portion of the first bottom side, and wherein a second dielectric casing defines at least a portion of the top side, and wherein the first and second dielectric casings have substantially equal lateral dimensions.

15. The stacked system of claim 14 wherein a lateral side of the first dielectric casing has a sloped profile.

16. The stacked system of claim 14 wherein a lateral side of the second dielectric casing has a sloped profile.

17. The stacked system of claim 12 further comprising an adhesive layer positioned between the top side of the second microelectronic device and the first bottom side of the first microelectronic device.

18. A stacked system of microelectronic devices, comprising:
    a first microelectronic device having a first die, a first bottom side, and first metal leads coupled to the first bottom side;
    a second microelectronic device having a second die, a top side, a lateral side, a second bottom side, a second bottom side bond-site, and second metal leads coupled to the second bottom side, the second leads including a lateral portion that laterally projects away from the lateral side, a tiered portion that laterally projects towards the lateral side, and an angled portion between the lateral portion and the tiered portion that positions the tiered portion above the lateral portion, wherein the angled portion is substantially perpendicular to the lateral portion and the tiered portion;

metal solder bumps between individual first leads and individual tiered portions of the second leads;

a support substrate adjacent to and spaced apart from the second bottom side, the support substrate having a substrate bond-site; and a substrate connector attached to the substrate bond-site and to the second bottom side.

19. The stacked system of claim 18 wherein the tiered portion is separated from a corresponding first lead by a vertical distance of up to 60 microns.

20. The stacked system of claim 18 wherein the redistribution structure includes layered metal traces.

* * * * *